United States Patent [19]
Stinnett et al.

[11] Patent Number: 5,900,443
[45] Date of Patent: May 4, 1999

[54] POLYMER SURFACE TREATMENT WITH PARTICLE BEAMS

[76] Inventors: Regan W. Stinnett, 1033 Tramway La. NE., Albuquerque, N.M. 87122; J. Pace VanDevender, 7604 Lamplighter NE., Albuquerque, N.M. 87109

[21] Appl. No.: 08/757,954

[22] Filed: Nov. 22, 1996

Related U.S. Application Data

[63] Continuation of application No. 08/376,883, Jan. 23, 1995, abandoned, which is a continuation-in-part of application No. 08/153,248, Nov. 16, 1993, Pat. No. 5,473,165.

[51] Int. Cl.$^6$ .................... C09J 5/02; C08F 2/46; C07C 1/00
[52] U.S. Cl. .................. 522/1; 522/157; 522/161; 522/163; 250/492.1; 250/492.21; 250/492.3; 156/272.2; 156/272.6; 204/157.15; 204/157.63
[58] Field of Search ................... 522/1, 2, 157, 522/161, 163; 204/157.15, 157.6, 157.61, 157.63; 250/492.21, 492.3, 492.1; 428/412, 411.1; 156/272.2, 272.6

[56] References Cited

U.S. PATENT DOCUMENTS

| | | | |
|---|---|---|---|
| 4,457,817 | 7/1984 | Bobeth et al. | 522/2 |
| 5,178,726 | 1/1993 | Yu et al. | 156/643 |
| 5,286,550 | 2/1994 | Yu et al. | 428/212 |
| 5,332,625 | 7/1994 | Dunn et al. | 522/165 |
| 5,389,195 | 2/1995 | Ouderkirk et al. | 156/643 |

FOREIGN PATENT DOCUMENTS

| | | |
|---|---|---|
| 859 121 | 12/1970 | Canada. |
| 1 315 966 | 4/1993 | Canada. |

*Primary Examiner*—Susan W. Berman
*Attorney, Agent, or Firm*—DeWitt M. Morgan, Esq.; Gregory A. Cone, Esq.

[57] ABSTRACT

A polymer surface and near surface treatment process produced by irradiation with high energy particle beams. The process is preferably implemented with pulsed ion beams. The process alters the chemical and mechanical properties of the polymer surface in a manner useful for a wide range of commercial applications.

29 Claims, 12 Drawing Sheets

UNTREATED SURFACE
(POLYETHYLENE)

TREATED SURFACE
(0.5-1 J/cm2)
POLYETHYLENE

POLYMER SURFACE TREATMENT WITH PARTICLE BEAMS

This application is a continuation of application Ser. No. 08/376,883 filed on Jan. 23, 1995, now abandoned, which is a continuation-in-part of patent application Ser. No. 08/153,248 filed Nov. 16, 1993, assigned to assignee of the present invention, now U.S. Pat. No. 5,473,165.

This invention was made with Government support under Contract DE-AC04-94AL85000 awarded by the U.S. Department of Energy. The Government has certain rights in the invention.

BACKGROUND OF THE INVENTION

This invention relates to a process for treating the surface and near surface regions of a polymer with high intensity pulsed ion beams with sufficient beam fluence to achieve the various effects of cross-linking, pyrolyzing, etching or ablating the polymer in the treated areas. More particularly, the ion beam pulses are characterized by pulse widths of less than 10 microseconds per spatially contiguous pulse, beam intensities of 0.01 to 10 $J/cm^2$, and ion energies of typically greater than 25 keV.

The use of beams of high energy particles or photons for modifying polymers has been known and practiced for years using sources of particles such as the radiation decay products of radioactive elements (e.g. $^{60}Co$) and electron beams produced from continuous and pulsed beam sources. Typical ion beam polymer treatment uses sources of high energy ions from expensive, research-type accelerators such as linear accelerators (linacs) or Van de Graff accelerators that are expensive, produce very low dose rates and, although useful as diagnostic tools for research, are not suitable for commercial treatment. Electron beams (typically >1 MeV electrons) are used to deliver dose rates to polymers up to several hundred Mrad/hr. Photons (10–30 eV) have also been used to treat polymer surfaces by inducing chemical reactions. Continuous, high energy photon (γ) sources (e.g. $^{60}Co$ with 1–3.5 MeV photons) are most commonly used for commercial irradiation of polymers. These techniques have demonstrated the ability of high energy particles at dose levels of order 10–100 Mrad to produce beneficial changes to polymers including improved toughness, resistance to solvents, and increased adhesion, as well as changes in optical density and electrical conductivity.

Although present techniques have been shown to be valuable in many polymer treatment applications, these treatment methods have several shortcomings.

The treatment typically extends deep into the material (e.g., the range of 1 MeV electrons is approximately 0.5 cm, the range of MeV photons is >>1 cm). This relatively deep treatment requires large total treatment doses to produce a significant effect. This occurs because of the difficulty in obtaining high fluences of low energy particles using existing treatment methods and the problem of surface heating that results from high continuous irradiation levels.

Any of the techniques described above for irradiation of polymers will produce reaction products, such as free radicals, ionized molecules, and broken bonds, along the regions caused by energy deposition from particles moving through the polymer. Interaction between such reaction products would both increase the rate of the expected chemical reactions within the polymer (such as cross-linking) and enable unusual reactions normally precluded by the relative stability of the carbon-carbon bond. However, the low dose rates available using present technology precludes such interactions, as the density of reaction products is far too low. Even if the total dose is large enough to produce closely spaced tracks (taking minutes to hours), the time between the creation of adjacent tracks is longer than the typical recombination lifetimes of many of the reaction products (<1 microsecond for ions and excited states, >1 µs and longer for free radicals). This means that the advantages of increased interactions between reaction products resulting from high densities of reaction products cannot be realized using present techniques.

Present techniques also cannot produce dose rates sufficient to produce effective pyrolyzation (removal of hydrogen and oxygen) or etching (removal of material by rapidly heating the surface material beyond the point at which it begins to vaporize) of polymer surfaces without significantly affecting the underlying material. In addition, high pulsed doses of particles delivered to polymer surface regions can also modify the topology of the near surface region (e.g. by producing a rougher surface texture) in a way that present technology cannot support.

SUMMARY OF THE INVENTION

The limitations of the prior art techniques are surmounted by the present invention. Applying high intensity pulses of particles to the surface and near surface regions of a polymer simultaneously produces a high density of ion track excited regions within the treated region of the polymer while limiting the total energy deposition required for such excitation. In addition, the invention makes possible effective dispersal of heat produced by the irradiation and a relatively energy-efficient means of irradiation.

The above abilities and their concomitant advantages are realized by a process which utilizes a pulsed high intensity particle beam to treat the surface and near surface regions of the polymer. Pulsed ion beams are particularly useful for reasons that will be made clear below. Each spatially contiguous pulse of the ion beam delivers a fluence of typically 0.01 to 10 $J/cm^2$ of a selectable ion species into the polymer surface in less than 10 microseconds. This level of ion fluence produces an ion track density within the polymer sufficient that a substantial percentage of the polymer molecules excited (i.e., broken bonds, free radicals, excited bonding states, etc.) by interaction with the energetic ions can interact directly with other excited polymer molecules, thereby creating an environment for cross-linking and other chemical reactions unlike any conventional environment.

The relatively thin surface region of the polymer treated by this process is instantaneously raised to a much higher temperature, then flash-cooled by rapid conduction of heat into the underlying regions of the polymer without the adverse effects normally produced by the longer duration heating periods necessarily produced by prior art techniques. Accordingly, the pulsed ion beam process is also useful for etching or ablating away unprotected portions of the polymer surface, pyrolizing of the polymer surface, changing the geometry and topology of the polymer surface, and inducing thermally-activated chemical changes within the polymer.

DETAILED DESCRIPTION OF THE INVENTION

Figure 1:
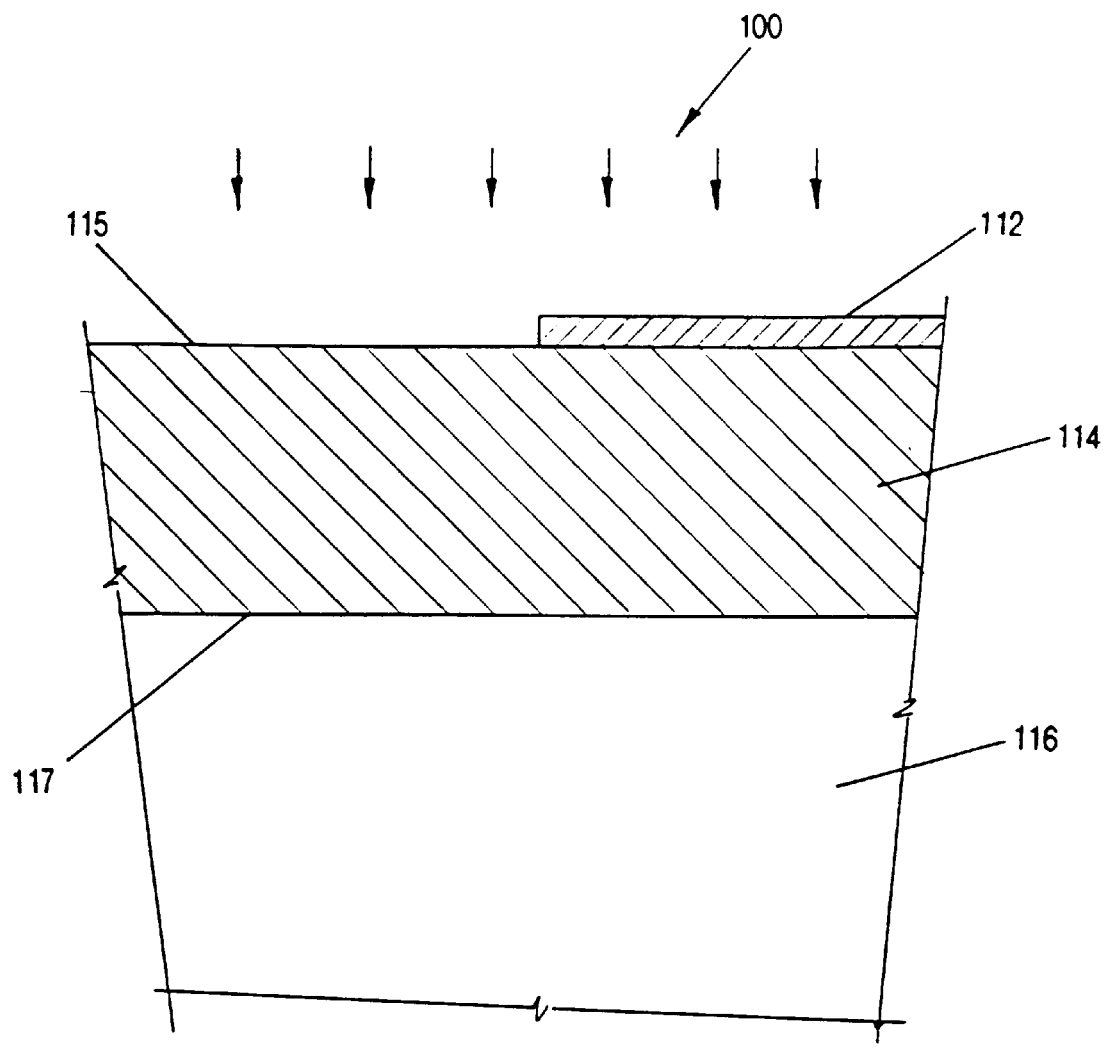
FIG. 1 is a cut away cross sectional view of a surface of a polymer undergoing irradiation by the pulsed ion beam.

The invention herein is most readily implemented in either of two techniques, called Ion Beam Surface Treatment (IBEST) and Electron Beam Surface Treatment (EBEST), as illustrated in FIG. 1. IBEST and EBEST avoid the problems listed above by providing a method for producing commercially viable fluences (0.01–10 J/cm$^2$) of selectable particle species with energies of typically >25 keV in pulse lengths that can range from a few nanoseconds to several microseconds. The value of this new capability is based on several factors.

IBEST uses pulsed power and intense ion beam technology to treat polymer surfaces with very intense, but relatively short, pulses of ions. The ability to produce such pulses of ions in single or few pulse bursts at relatively low (<1 Hz) repetition rates has existed for several years but the potential benefits of such pulses have not previously been recognized. This lack of recognition is probably because these techniques could not be developed into commercially viable processes, partially because of a very limited lifetime (<1000 pulses) for key components and partially because of severely limited average power.

A new capability that enables and adds to the value of this process is the combination of repetitively pulsed power technology as demonstrated by RHEPP I and RHEPP II, developed at Sandia National Laboratories, with repetitive intense ion beam technology as demonstrated by the Magnetically-confined Anode Plasma ion beam system. We can use a variety of methods to produce and deliver intense pulses of ions to a polymer surface. RHEPP/MAP technology is a representative example of this new capability. These technologies combine to provide a new, commercially viable method to deliver up to several hundred kW or more of average ion power at tens of keV to MeV ion kinetic energies in intense short duration (~30 nsec—10 μsec) pulses. Such ion beam pulses are capable of producing the effects described above. These parameters allow low cost (on the order of 1 cent/sq. ft) treatment of high volumes of polymer with long lifetime (>>1000 pulses) systems. This capability is the first of its kind.

The depth of treatment can be chosen by selecting different ion species and kinetic energies. In many cases it is desirable to treat only the near surface region of a polymer with the object of providing a tougher, scratch and solvent resistant surface with improved adhesive properties. For such surface treatment applications it may only be necessary to treat a near-surface region having a depth of perhaps a few microns. By contrast, a high energy pulsed electron beam system will affect on the order of a few mm before the electrons stop in the polymer. Accordingly, the ability to use high energy pulses of ions and to adjust the ion energy and species to treat only this depth allows us to greatly reduce (typically by factors of up to 1000) the energy needed per unit area while still achieving the desired modification of near surface properties.

Figure 4:
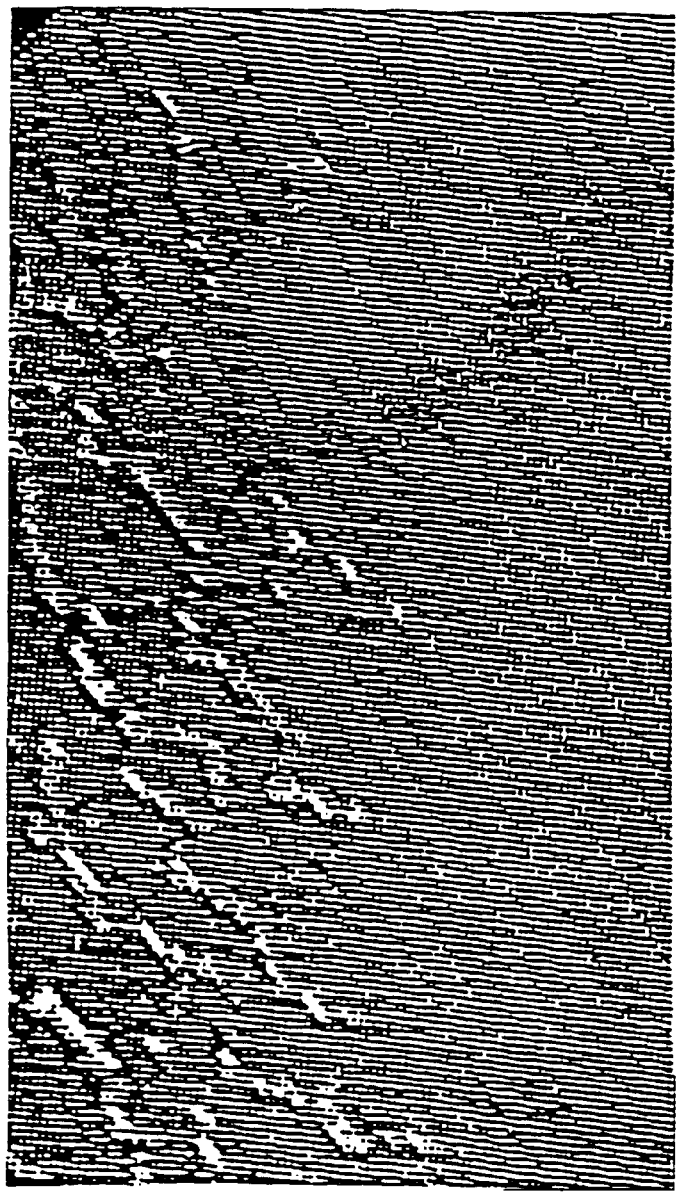
FIG. 4 is a microphotograph showing the change in the surface structure of a polypropylene surface after irradiation.
Figure 5:
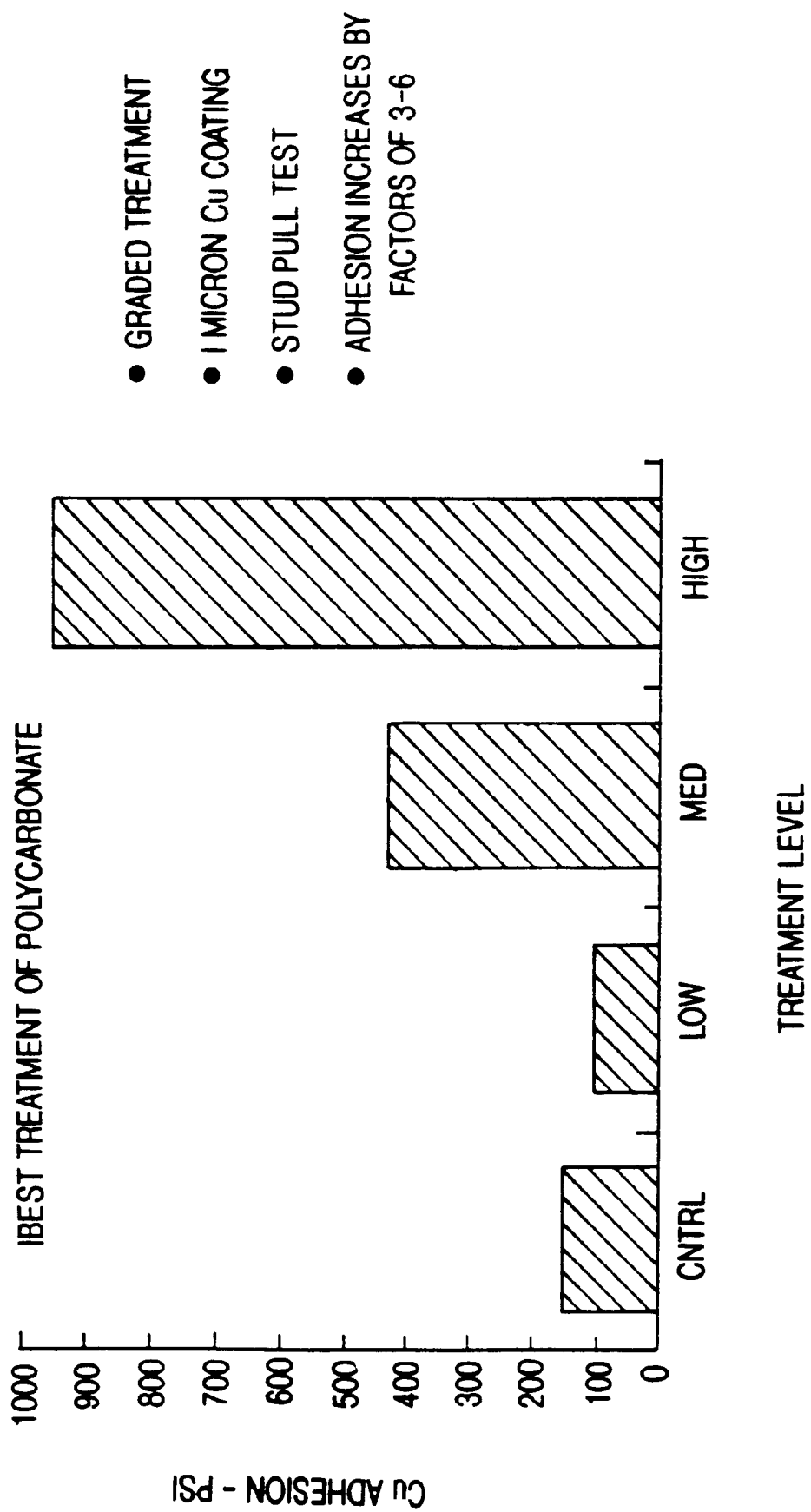
FIG. 5 is a bar chart showing the improved adhesion characteristics of a polycarbonate surface with varying degrees of ion beam irradiation; low≈0.1 J/cm$^2$, med.≈0.5 J/cm$^2$, high≈1–2 J/cm$^2$.

There are other advantages to the use of high energy ion beam pulses. The ability to deliver a short, high-intensity pulse (0.01–10 J/cm$^2$) of ions in a few ns to several microseconds produces a relatively uniform high-density treatment of the near-surface region in which the reaction products (e.g. polymer ions, excited states, free radicals) resulting from interaction with the energetic ions can directly interact with other such reaction products as well as with unexcited polymer molecules. This mode of chemical reaction contrasts to the low ion density case where ion-induced reaction products interact only with neighboring unexcited polymer molecules. No existing technology is capable of achieving conditions within several orders of magnitude of that required to produce the desired high-density treatment. This new capability has been shown to produce changes in the chemistry and bond structure of polymers (FIGS. 2 and 3) and has been shown to improve adhesion of coatings to different polymer surfaces (FIGS. 4 and 5). This new technology will also enable new surface topologies, compositions, chemistries and bond structures to be produced due in part to the novel high-density treatment capability.

From TRIM-90, a well-known computer simulation package, the local dose from a 400 keV H$^+$ ion moving through polycarbonate (density of 1.2 g/cm$^2$) is approximately $1.3 \times 10^{-10}$ J/g ($1.3 \times 10^{-5}$ rad) per incident H$^+$ ion. A pulse of 0.25 J of H$^+$ at 400 keV contains $4 \times 10^{12}$ H$^+$ ions. This results in a local dose of approximately 50 Mrad delivered in 100 ns for a dose rate of $5 \times 10^8$ Mrad/second. During this time the temperature of the polymer rises approximately 500 K. The radius, $r_p$, of effects induced around the ion track (due to ionization, excitation, and the effects resulting from secondary electron formation and their resulting ionization and excitation, and the effects resulting from surrounding region) is approximately 15 nm (from *Radiation Effects on Polymers*, ed. R. Clough and S. Shalaby, Ch. 2, p 48) for 400 keV H$^+$. The density needed for overlapping of these track effects occurs when the incident ion density exceeds N=($\frac{1}{2}r_p$)$^2$=$1 \times 10^{11}$/cm$^2$. Our incident ion density of $4 \times 10^{12}$ greatly exceeds this threshold and will allow significantly enhanced reaction product densities because they are delivered on a timescale short or comparable to the recombination times of the reaction products formed along the track Our treatment will also produce microscopically homogenous treatment of the surface due to the overlapping tracks.

There are other aspects of the use of high-density pulsed ion beam treatment of polymers which require some analysis. The temperature increase from a 0.25 J/cm$^2$ pulse of protons on polycarbonate is about 500° K, as mentioned above. If one pulse is adequate for the desired treatment, this level of temperature rise is safe for the great majority of polymers. However, if a multi-pulse treatment is necessary, the polymer surface must have time to cool between pulses, or the temperature increase will be much greater, perhaps causing significant problems. Also, if the temperature rise is maintained for too long, the polymer may be damaged. The essential problem here is the extremely low thermal conductivity of some polymers.

The characteristic timescale for heat to diffuse a length $\lambda$ in a material is $$\Delta t \sim c\rho\lambda^2/\kappa,$$

where c is the specific heat per gram of the polymer, $\rho$ is the density of the polymer, and $\kappa$ is the thermal conductivity of the polymer. Using this relation, one can easily show that the increase in temperature over that of the polymer bulk falls to about 250° K after ~3 $\mu$sec, and to a mere 30° K after ~250 $\mu$sec. Clearly multiple pulses pose no problem as long as the repetition rate is less than about $10^5$ per second, and we contemplate a maximum of ~1000 pps. Damage to the polymer resulting from one pulse is not as clear an issue, but a material would have to be very sensitive to sustain significant damage from such a modest temperature rise that is effectively quenched in about 10 $\mu$seconds.

The other issue coming out of the thermal timescale analysis concerns the thickness of the polymer near-surface region which may be excited. If there is a reason, a region as thick as ~100 $\mu$m may be irradiated. For such a thick layer, the thermal time constant is ~2 milliseconds. Clearly this does not offer either rapid quenching or extremely short exposure to heat, but also does not represent a major limitation to use of pulsed ion beam treatment on polymer surfaces.

The ability to deliver high fluences of ions to a surface in a short pulse enables this process to be used for pyrolyzing (removing hydrogen and/or oxygen from) polymer surfaces as well as etching and modifying the geometry of the surface. An example of the ability of this technology to modify the surface geometry is shown in FIG. 6 in which a polyethylene surface was treated with an ion beam at a level of approximately 0.5 J/cm$^2$ resulting in the production of a relatively uniform array of holes or pits with micron size dimensions. Altering a polymer in this manner can be beneficial by providing adjustable electrical conductivity, increased surface area, improved adhesion of coatings, and with masking, the ability to spatially vary these properties along the surface.

The combination of the reduced energy/unit area needed for treatment and the high intensities available on a repetitively pulsed basis with this new technology enables, for the first time, vary rapid treatment of polymer surfaces at low cost with a totally chemical-free process. It is estimated that treatment rates of >100 sq. ft./second at a cost of 1 cent/sq. ft. are possible using this technology.

The present invention provides the first capability to achieve high densities of free radicals, even up to conditions in which the effects of reaction products from adjacent ion tracks overlap. This allows an entirely new regime of radiation treatment to be explored in which the reaction products react more strongly with each other, rather than simply with the polymer.

Existing continuous techniques deliver doses of perhaps 500 Mrad per hour (0.14 Mrad/sec.). Prior art pulsed techniques are based on long pulsed electron beams or very low average power research accelerators capable of dose rates of order $10^5$ Mrad/sec. This is still too low to produce overlapping tracks. Typical dose rates with the present process will be 100 Mrad in $1\times10^{-7}$ seconds (>$10^8$ Mrad/sec.), approximately three orders of magnitude faster. One effect of this will be that the resulting higher free radical density will allow free radicals to combine quickly with each other, resulting in greatly increased efficiency of crosslinking and other reactions. With existing techniques, free radicals may remain uncombined for hours to days, finally combining in many cases with oxygen, permanently terminating the chain and resulting in scission rather than crosslinking.

The ability to localize treatment to the surface will result in many applications that can be done at greatly reduced cost. Existing techniques use particles that penetrate much more deeply into the material (>1 mm) rather than only the few microns or less that can be achieved by ion beams. The reduced penetration can result in orders of magnitude less energy needed to reach the same local treatment dose, correspondingly reducing the cost of treatment in applications that only require near-surface treatment.

This process allows rapid treatment of material because of its intense, pulsed nature. The short pulse allows one to easily control and limit the local dose and heating of the surface, allowing it to cool between pulses while still preserving the advantages of the high intensity.

Figure 6A:
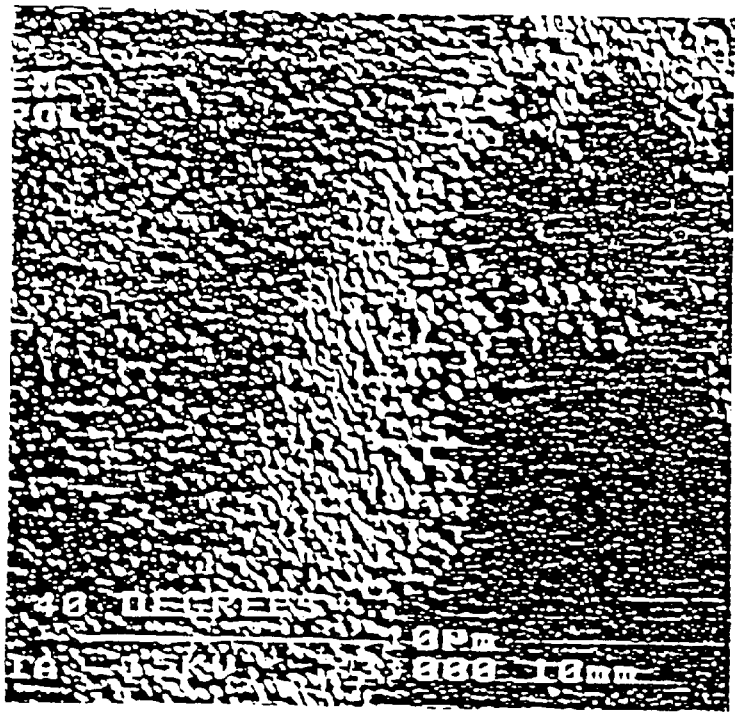
FIG. 6A is a scanning electron microscope photograph showing an untreated polyethylene surface.
Figure 6B:
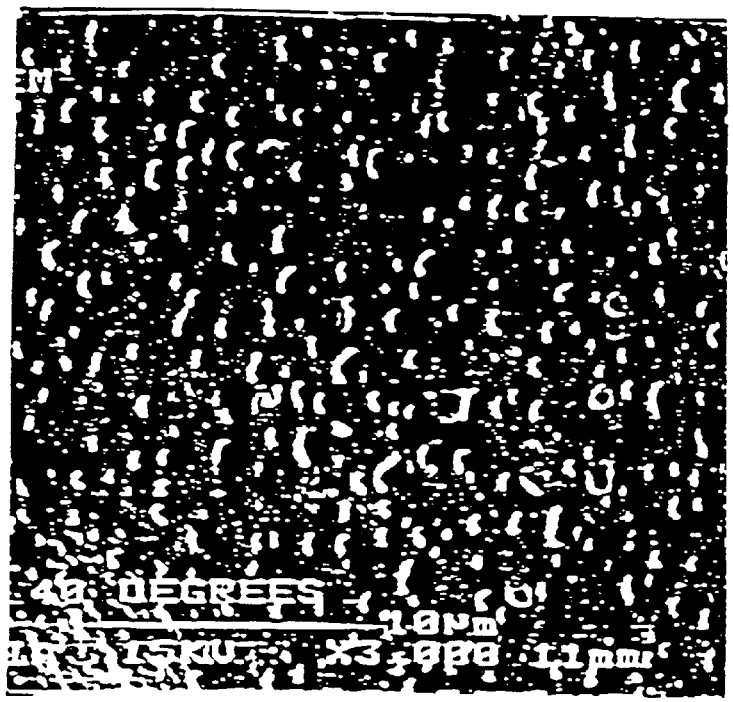
FIG. 6B is a scanning electron microscope photograph showing a similar polyethylene surface (from the same batch as FIG. 6A) after treatment with a 0.5–1.0 J/cm$^2$ ion beam.

In addition to the reaction products, this technique, because of its high intensity, can also modify the surface of polymers by changing the topology of the surfaces. FIGS. 6A and 6B show an example of this modification. The holes formed in the surface can be advantageous in various ways, including the ability of deposited films to more easily mechanically adhere to the rough surface. Pyrolyzing and etching by ablation of the surface are also techniques made possible by the high intensities. The short pulse nature of this process allows these effects to be exploited near the surface without affecting the underlying material.

Another important advantage of this short pulsed technique is that the polymer surfaces can be raised to temperatures higher than those that can be used in long timescale processing without degradation due to heating. This heating to high temperatures for only very short times does not have the same degrading effect on polymers that a similar temperature would have for long times. For example, pulsed laser heating has shown that KAPTON can be raised to 1000° C. for microsecond periods without deleterious effects. This advantage can also have beneficial effects in cases for which processing at elevated temperatures is desirable.

Turning now to the drawings, FIG. 1 shows a cross section of a polymer undergoing irradiation by the process of this invention. The process is described in terms of ion beams, but electron beams and gamma ray beams are also useful in this process. The ions 100 from the pulsed ion beam enter into the surface 115 of the polymer 116 down to a depth 117 determined by the species and the kinetic energy of the particular ion used. It is in this upper region between 115 and 117 that the effects of the irradiation are most pronounced. The heat created in this region by the ion pulse is very rapidly dissipated into the region of the polymer underlying the interface 117, thereby preventing the adverse effects of longer term heat buildup in the upper region. This figure also shows another layer of material 112 emplaced above the upper surface 115 of the polymer 116. The layer can be one of two different types of materials. If it is used as a mask layer, it will protect the underlying areas of the polymer from the effects of the radiation. If it is to be a surface coating layer for the polymer or another material which is intended to be incorporated in some more or less permanent fashion onto or into the upper surface of the polymer, it will be a type of material through which the ion beams pass to the extent necessary to bond the material at the interface 115 with the polymer or to otherwise melt or diffuse the material thereinto. For example, an H+ beam at 0.4 MeV, will have a 5 micron range in polypropylene and cause a temperature increase of 110 K for a 10 Mrad pulse (0.1 J/cm$^2$). The resulting ionization and disruption of polymer bonds caused by the ion pulse will form free radicals which then recombine to cross-link the polymer chains within the polymer surface. Additionally, if the material 112 is of the appropriate type, such as epoxy or another polymer material, it also will be treated by the ion pulse and bind to the underlying polymer.

A 30 keV electron beam has a 10 micron range in polypropylene, produces a temperature increase of 112 C. for a 10 Mrad pulse (0.2 J/cm$^2$) and produces similar polymer alteration effects to those described above for ion beam irradiation.

Figure 2:
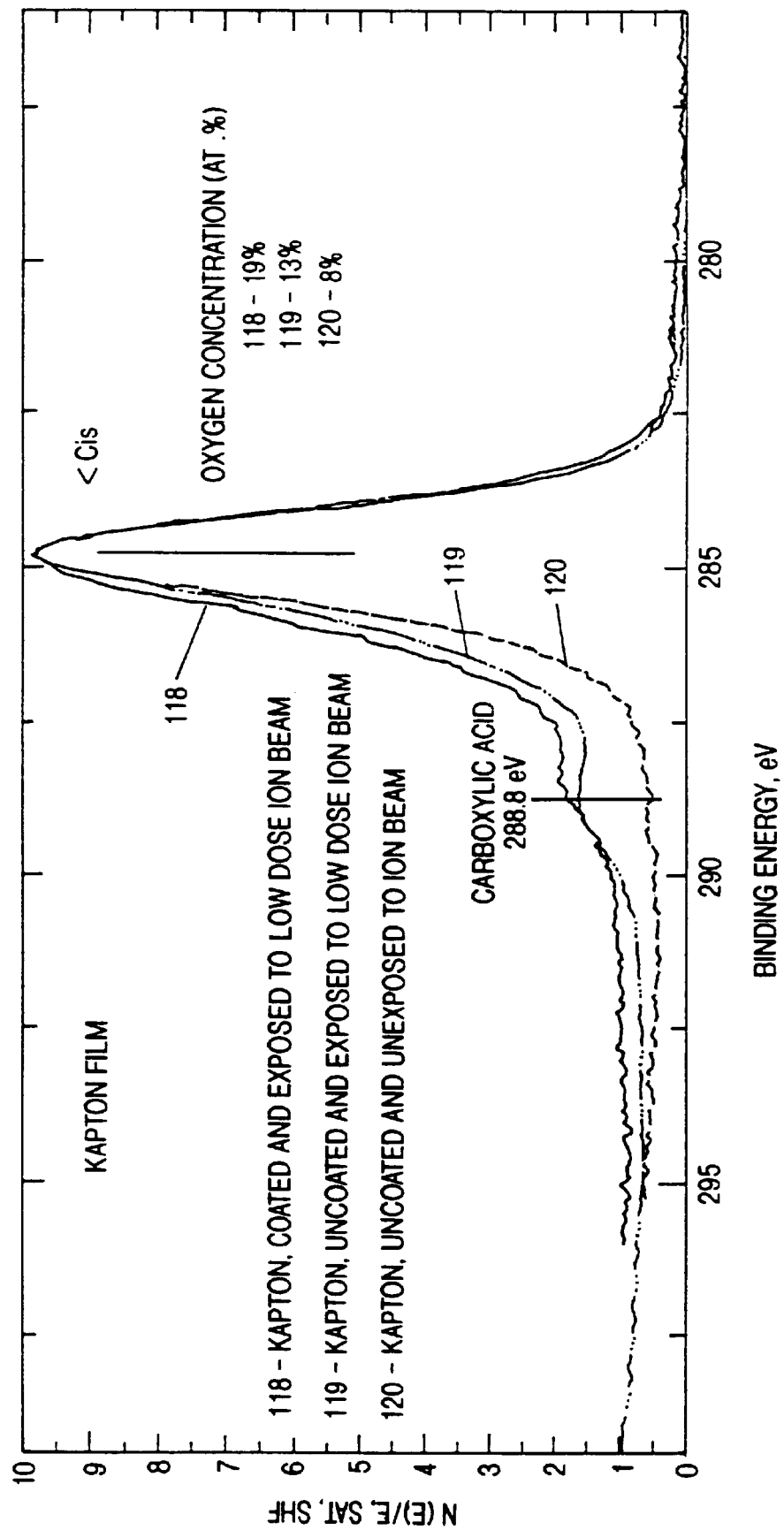
FIG. 2 is a graph plotting normalized density of states as a function of binding energy for KAPTON (polyimide), obtained by using x-ray photoemission spectroscopy, both with and without an oxygen-containing chemical coating, demonstrating the change in oxygen concentration in the KAPTON.

FIG. 2 is a graph obtained using the x-ray photoemission spectroscopy diagnostic showing the changes in the polymer chemistry of KAPTON (polyimide) under control conditions without irradiation, after being irradiated with a low dose ion beam pulse (a mixed carbon, proton beam at 0.2–0.6 MV), and after being irradiated with a low dose beam through a 50–100 nm thick oxygen-containing coating. The graph reveals that the carboxylic acid level of the KAPTON has increased with the pulsed ion beam treatment, verifying chemical changes induced by treatment.

Figure 3:
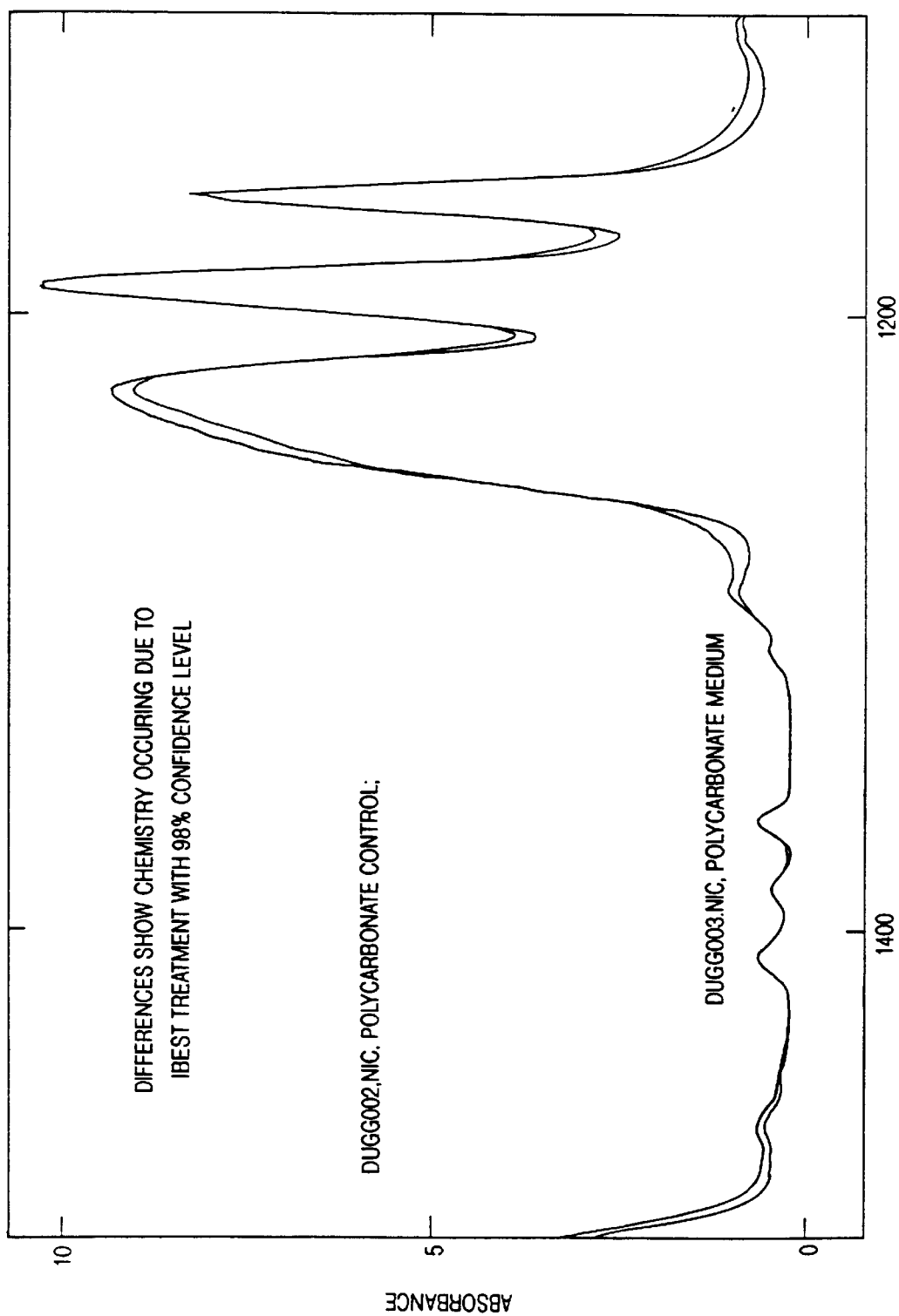
FIG. 3 is graph plotting absorbance (measured using Fourier Transform Infrared Spectroscopy) as a function of wavenumber for treated and untreated polycarbonate, again demonstrating the change in chemical composition of the polymer before and after treatment.

FIG. 3 is a graph obtained using Fourier Transform Infrared Spectroscopy showing the chemical signature shift in a polycarbonate before and after treatment with the pulsed ion beam. The parameters of the treatment were approximately 0.5 J/cm$^2$ of mixed H$^+$ and C$^+$ delivered in an approximately 200 ns pulse.

FIG. 4 is a microphotograph showing the change in surface geometry of a polypropylene surface coated with one micron of copper at the transition between a treated and an untreated region. The treatment parameters here were as above. Other tests of this material indicated improved copper adhesion to the polycarbonate in similarly treated areas.

FIG. 5 is a bar chart showing different adhesion strengths as a function of treatment intensity for polycarbonate coated with one micron of copper. A stud was attached to the copper coating and pulled until the copper layer separated from the polycarbonate. The treatment levels were 0.1 J/cm$^2$ (low), 0.5 J/cm$^2$ (med.), and 1–2 J/cm$^2$ (high).

FIG. 6A is a microphotograph of an untreated polyethylene surface. FIG. 6B is a microphotograph of the surface after treatment at 0.5–1.0 J/cm$^2$ to form the uniformly pitted surface shown. This treated surface exhibits increased adhesion characteristics.

The invention requires a system capable of delivering ion beams of the requisite power and timing over commercially realistic work periods. One such system is described in co-pending patent applications Ser. No. 08/153,248 filed Nov. 16, 1993, now U.S. Pat. No. 5,473,165; Ser. No. 08/317,948 filed Oct. 4, 1994, now U.S. Pat. No. 5,582,495; and Ser. No. 08/340,519 filed Nov. 16, 1994, now U.S. Pat. No. 5,525,805, which are incorporated herein by reference in their entirety. The discussion that follows is excerpted from these applications to describe the best mode presently known for the practice of this invention.

The following discussion is a description of one system which can be utilized to produce the ion beams for surface treatment of various materials. This system has two major subsystems, a pulsed power source and a Magnetically-confined Anode Plasma (MAP) ion diode.

The MAP ion diode, when combined with the repetitive high energy pulsed power (RHEPP) source, provides for an ion beam generator system capable of high average power and repetitive operation over an extended number of operating cycles for treating large surface areas of materials at commercially attractive costs. In particular, the ion beam generator of the present invention can produce high average power (1 kW–4 MW) pulsed ion beams at 0.025–2.5 MeV energies and pulse durations or lengths of from about 10 nanoseconds (ns)–2 microseconds ($\mu$s) or longer as necessary for the particular application. The ion beam generator can directly deposit energy in the upper regions of the surface of a material. The depth of treatment can be controlled by varying the ion energy and species as well as the pulse length. The MAP ion diode can be combined with other power sources where less demanding power demands are present.

The first of the components in the pulsed ion beam generating system is a compact, electrically efficient, repetitively pulsed, magnetically switched, pulsed power system capable of 10$^9$ pulse operating cycles of the type described by H. C. Harjes, et al, Pro 8th IEEE Int. Pulsed Power Conference (1991), and D. L. Johnson et al., "Results of Initial Testing of the Four Stage RHEPP Accelerator" pp. 437–440 and C. Harjes et al., "Characterization of the RHEPP 1 $\mu$s Magnetic Pulse Compression Module", pp. 787–790, both reprinted in the Digest of Technical Papers of the Ninth IEEE International Pulsed Power Conference, June, 1993, all of which is incorporated by reference herein. These references in conjunction with the discussion herein below place fabrication of such a pulsed power source within the skill of the art.

Figure 7:
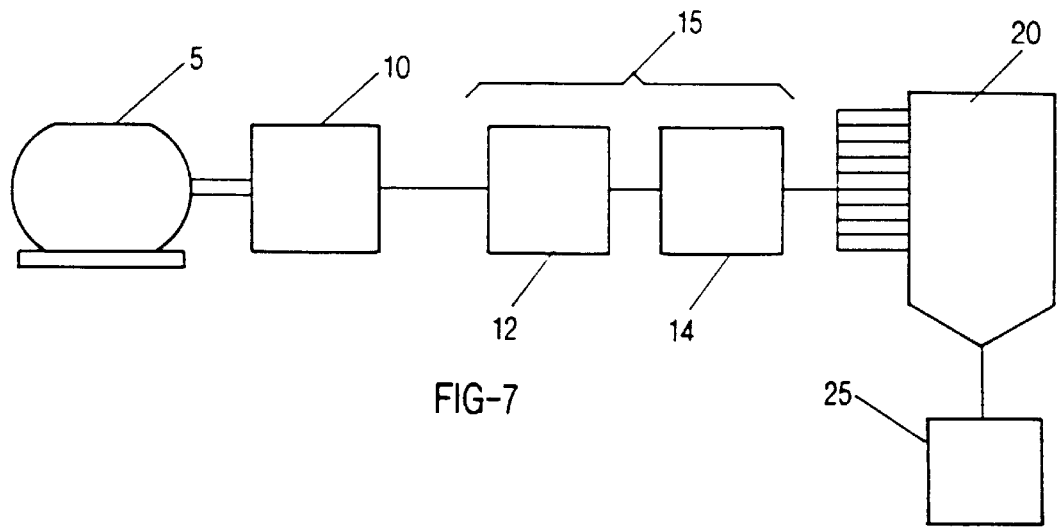
FIG. 7 is a schematic of the RHEPP pulsed power system.

A block diagram of a power system produced according to the teachings of the present application is shown in FIG. 7. From the prime power input, several stages of magnetic pulse compression and voltage addition are used to deliver a pulsed power signal of up to 2.5 MV, 60 ns FWHM, 2.9 kJ pulses at a rate of 120 Hz to an ion beam source for this particular system. The power system converts AC power from the local power grid into a form that can be used by an ion beam source 25.

Referring to FIG. 7, in one embodiment of the invention, the power system comprises a motor 5 which drives an alternator 10. The alternator 10 delivers a signal to a pulse compression system 15 which has two subsystems, a 1 $\mu$s pulse compressor 12 and a pulse forming line 14. The pulse compression system 15 provides pulses to a linear inductive voltage adder (LIVA) 20 which delivers the pulses to the ion beam source 25.

The alternator 10 according to one embodiment is a 600 kW, 120 Hz alternator. In the unipolar mode, it provides 210 A rms at a voltage of 3200 V rms with a power factor of 0.88 to the magnetic switch pulse compressor system 15. The alternator is driven by a motor connected to the local 480V power grid. The particular alternator used herein was designed by Westinghouse Corporation and fabricated at the Sandia National Laboratories in Albuquerque, N. Mex. It is described in detail in a paper by R. M. Calfo et al., "Design and Test of a Continuous Duty Pulsed AC Generator" in the Proceedings of the 8th IEEE Pulsed Power Conference, pp. 715–718, June, 1991, San Diego, Calif. This reference is incorporated herein in its entirety. This particular power system was selected and built because of its relative ease in adaptability to a variety of loads. Other power sources may be used and may indeed be better optimized to this particular use. For example, a power supply of the type available for Magna-Amp, Inc. comprising a series of step-up transformers connected to the local power grid feeding through a suitably-sized rectifier could be used. The present system however has been built and performs reasonably well.

In one embodiment, the pulse compression system 15 is separated into two subsystems, one of which is a common magnetic pulse compressor 12 composed of a plurality of stages of magnetic switches (i.e., saturable reactors) the operation of which is well known to those skilled in the art. This subsystem is shown in more detail in FIG. 7A. The basic operation of each of the stages is to compress the time width (transfer time) of and to increase the amplitude of the voltage pulse received from the preceding stage. Since these are very low loss switches, relatively little of the power is wasted as heat, and the energy in each pulse decreases relatively little as it moves from stage to stage. The specific subsystem used herein is described in detail by H. C. Harjes, et al., "Characterization of the RHEPP 1 $\mu$s Magnetic Pulse Compression Module", 9th IEEE International Pulsed Power Conference, pp. 787–790, Albuquerque, N. Mex., June, 1993. This paper is incorporated by reference herein in its entirety. These stages as developed for this system are quite large. In the interest of conserving space, it would be possible to replace the first few stages with appropriately designed silicon control rectifiers (SCR's) to accomplish the same pulse compression result.

These stages 12 convert the output of the alternator 10 into a 1$\mu$s wide LC charge waveform which is then delivered to a second subsystem 14 comprising a pulse forming line (PFL) element set up in a voltage doubling Blumlein configuration. The PFL is a triaxial water insulated line that converts the input LC charge waveform to a flat-top trapezoidal pulse with a design 15 ns rise/fall time and a 60 ns FWHM. The construction and operation of this element is described in detail by D. L. Johnson et al. "Results of Initial Testing of the Four Stage RHEPP Accelerator", 9th IEEE International Pulsed Power Conference, pp. 437–440, Albuquerque, N. Mex., June, 1993. This paper is also incorporated by reference in its entirety. A cross sectional view of the PFL is shown in FIG. 7B.

Figure 7A:
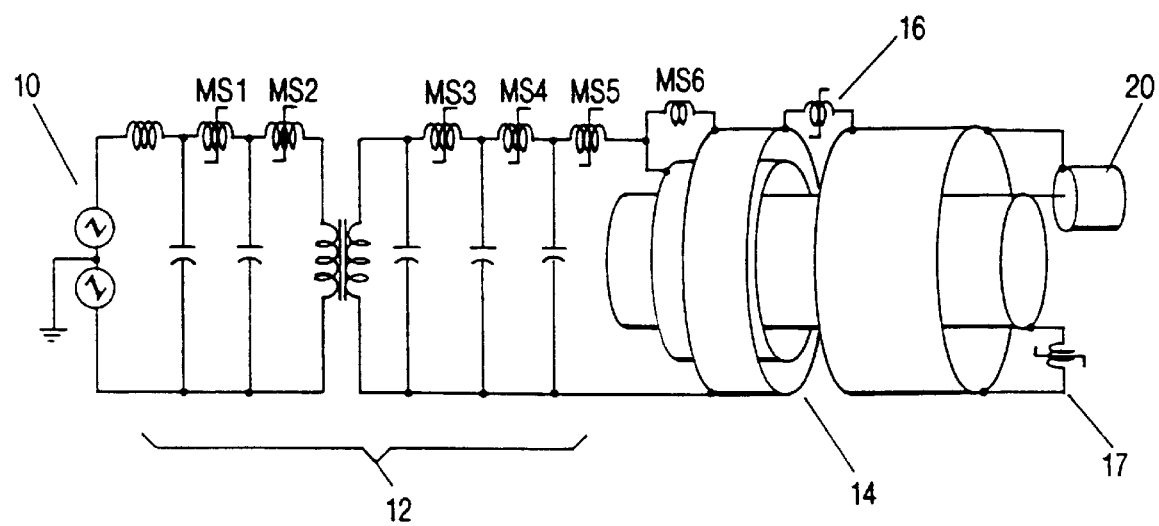
FIG. 7A is a circuit diagram of a pulse compression system utilized in the pulsed power system of FIG. 7.

The pulse compression system 15 can provide unipolar, 250 kV, 15 ns rise time, 60 ns full width half maximum (FWHM), 4 kJ pulses, at a rate of 120 Hz, to the linear inductive voltage adder (LIVA) (20). In a preferred embodiment, the pulse compression system 15 should desirably have an efficiency >80% and be composed of high reliability components with very long lifetimes ($\sim 10^9$–$10^{10}$ pulses). Magnetic switches are preferably used in all of the pulse compression stages, MS1–MS5 because they can handle very high peak powers (i.e., high voltages and currents), and because they are basically solid state devices with a long service life. The five compression stages used in this embodiment as well as the PFL 14 are shown in FIG. 7A. The power is supplied to the pulse compression system 15 from the alternator 10 and is passed through the magnetic switches, MS1–MS5, to the PFL 14. The PFL is connected to the linear induction voltage adder (LIVA) 20 described below. The second and third magnetic switches, MS2 and MS3, are separated by a step-up transformer T1 as shown. Switch MS6 is an inversion switch for the PFL.

Figure 7B:
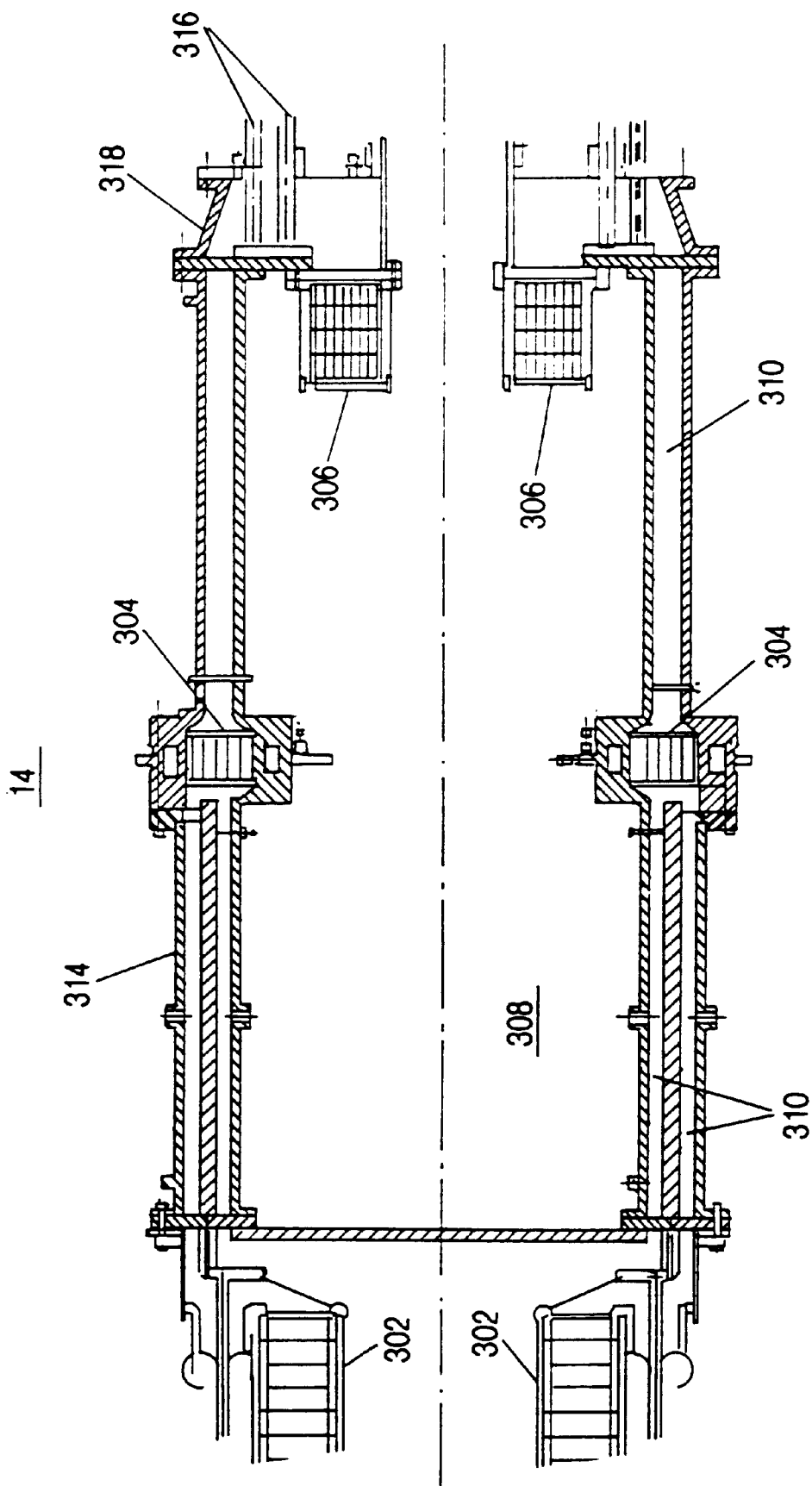
FIG. 7B is a cross sectional view of a pulse forming line element.

The pulse forming line (PFL) element 14 is shown in schematically in FIG. 7A and in cross section in FIG. 7B. MS6 in FIG. 7A corresponds to the inversion switch 302 shown in FIG. 7B located on the input side of the tri-axial section 314 of the PFL. Output switches 304 and charging cores 306 are also shown. The regions 310 are filled with deionized water as the dielectric. The interior region 308 is filled with air and oil coiling lines, not shown, for the output switches 304. The output of the PFL is fed in parallel to each of the individual LIVA stages 20, with the positive component flowing through conductors 316 and the shell 318 of the PFL serving as ground. The positive conductors 316 are connected to each of the LIVA stages.

Figure 7C:
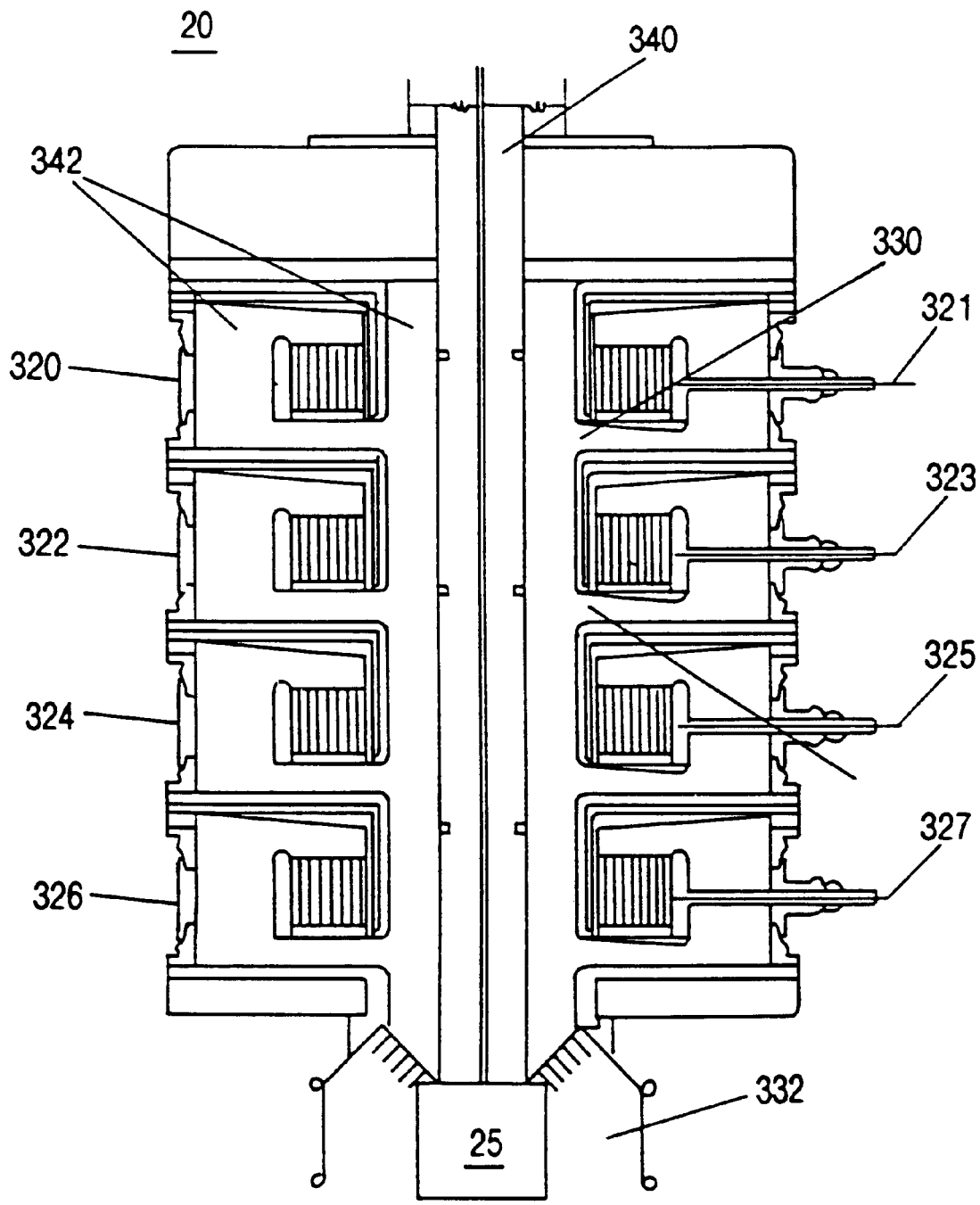
FIG. 7C is a cross sectional view of the Linear Inductive Voltage Adder (LIVA)

The LIVA (20) is preferably liquid dielectric insulated. It is connected to the output of the PFL and can be configured in different numbers of stages to achieve the desired voltage for delivery to the ion beam source. The LIVA 20 can deliver nominal 2.5 MV, 2.9 kJ, pulses at a rate of 120 Hz to the ion beam source 25 when configured with 10 stages of 250 kV each. For most of the ion beam treatments, the LIVA was configured with four stages of 250 kV each, such that the LIVA delivered a total of 1.0 MV to the ion beam source. However, this voltage can be increased or decreased by changing the number of stages in the LIVA to match the particular material processing need. The nominal output pulse of the LIVA 20 is the same as that provided to it by the PFL, namely, trapezoidal with 15 ns rise and fall times and 60 ns FWHM (full width half maximum). FIG. 7C shows a cross section of the four stage LIVA. The four stages, 320, 322, 324, and 326, are stacked as shown and fed the positive pulses from the PFL via the cables 321, 323, 325, and 327. The stages are separated by gaps 330 and surrounded by transformer oil for cooling. The output from each of the LIVA stages adds to deliver a single total pulse to the ion beam source shown here schematically as 25 which is located within a vacuum chamber 332, shown in partial view. As with the PFL, the outside shell of the LIVA is connected to ground.

The power system P (FIG. 7) as described, can operate continuously at a pulse repetition rate of 120 Hz delivering up to 2.5 kJ of energy per pulse in 60 ns pulses. The specific power system described here can deliver pulsed power signals of about 20–1000 ns duration with ion beam energies of 0.25–2.5 MeV. The power system can operate at 50% electrical efficiency from the wall plug to energy delivered to a matched load. The power system P uses low loss pulse compression stages incorporating, for example, low loss magnetic material and solid state components, to convert AC power to short, high voltage pulses.

The ability to produce voltages from 250 kV or less to several MV by stacking voltage using a plurality of inductive adders incorporating low loss magnetic material is a principle feature when high voltages are needed, although it is also possible to use a single stage pulse supply, eliminating the need for the adder.

The power system can operate at relatively low impedances (<100$\Omega$) which also sets it apart from many other repetitive, power supply technologies, such as transformer-based systems. This feature allows high treatment rates and the treatment of large areas (5 to more than 1000 cm$^2$) with a single pulse so as to reduce edge effects occurring at the transition between treated and untreated areas.

Figure 8:
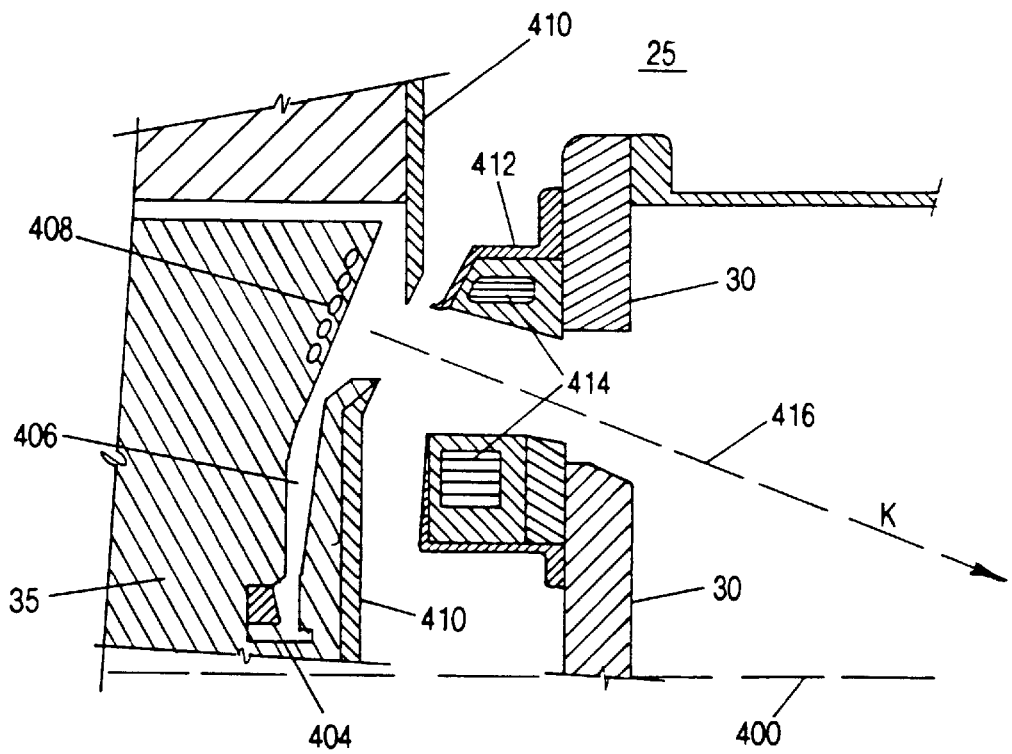
FIG. 8 is a partial cross sectional view of the magnetically-confined anode plasma (MAP) source 25.

The second component of the pulsed ion beam system is the MAP ion beam source 25 (shown in FIG. 8). The MAP ion beam source is capable of operating repetitively and efficiently to utilize the pulsed power signal from the power system efficiently to turn gas phase molecules into a high energy pulsed ion beam. It can also be operated in the single shot mode, as necessary for a particular application. A precursor of the ion beam source is an ion diode described generally by J. B. Greenly et al, "Plasma Anode Ion Diode Research at Cornell: Repetitive Pulse and 0.1 TW Single Pulse Experiments", Proceedings of 8th Intl. Conf. on High Power Particle Beams (1990) all of which is incorporated by reference herein. Although this reference ion diode differs significantly from the ion diode utilized in the present system as discussed above, the background discussion in this reference is of interest.

Figure 8A:
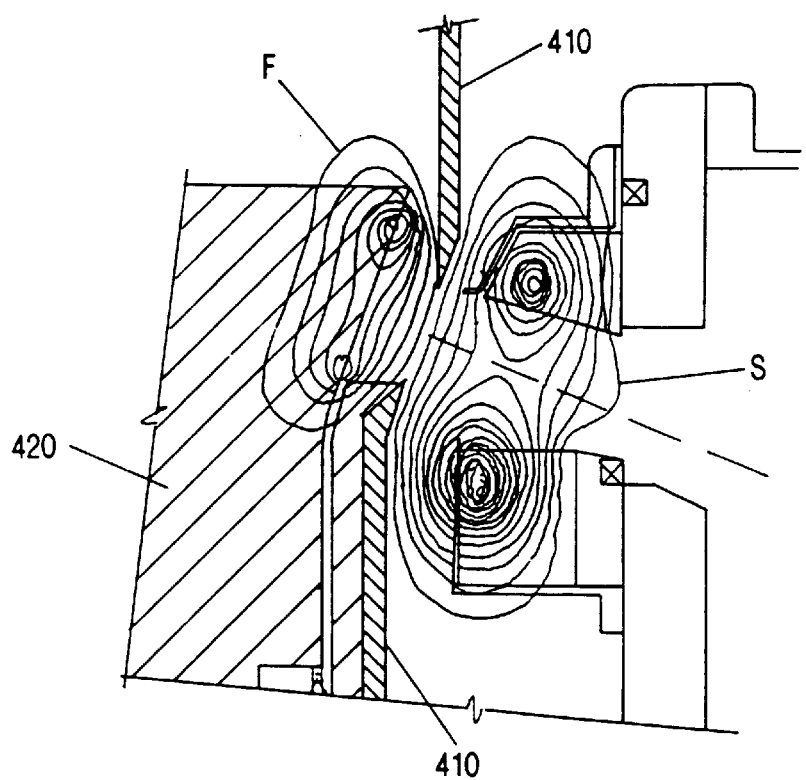
FIG. 8A is a modified version of FIG. 8 showing the magnetic field lines produced by the fast and slow coils in the MAP source.

The ion beam source 25, according to the principles of the present invention, is shown in FIG. 8. The ion beam source 25 is a magnetically-confined anode plasma (MAP) source. FIG. 8 is a partial cross-sectional view of one symmetric side of the ion beam or MAP source 25. The ion beam or MAP source 25 produces an annular ion beam K which can be brought to a broad focus symmetric about the axis X—X 400 shown. In the cathode electrode assembly 30 slow (1 ms rise time) magnetic field coils 414 produce magnetic flux S (as shown in FIG. 8A) which provides the magnetic insulation of the accelerating gap between the cathodes 412 and the anodes 410. The anode electrodes 410 also act as magnetic flux shapers. The slow coils 414 are cooled by adjacent water lines, not shown, incorporated into the structure 30 supporting the cathodes 412 and the slow coils 414. The main portion of the MAP structure shown in this Figure is about 18 cm high and wide. The complete MAP ion diode can be visualized as the revolution of the cross-sectional detail of FIG. 8 about the central axis 400 of the device to form a cylindrical apparatus. A full cross sectional view appears in FIG. 9.

The ion beam or MAP source 25 operates in the following fashion: a fast gas valve assembly 404 located in the anode assembly 35 produces a rapid (200 $\mu$s) gas puff which is delivered through a supersonic nozzle 406 to produce a highly localized volume of gas directly in front of the surface of a fast driving coil 408 located in an insulating structure 420. The nozzle is designed to prevent any transverse flow of non-ionized gas into the gap between the anodes 410 and cathodes 412. After pre-ionizing the gas with a 1 ms induced electric field, the fast driving coil 408 is fully energized from the fast capacitor 150, inducing a loop voltage of 20 kV on the gas volume, driving a breakdown to full ionization, and moving the resulting plasma toward the anode electrodes 410 in about 1.5 $\mu$s or less, to form a thin magnetically-confined plasma layer. The plasma momentarily stagnates at this B=0 region, the separatrix, next to the insulating field S produced by the slow coils 414, awaiting the delivery of the main accelerating positive electrical pulse to be delivered at the anodes 410 from the LIVA discussed above.

The gas can be effectively pre-ionized by placing a small ringing capacitor 160 in parallel with the fast coil. The field oscillations produced by this ringing circuit pre-ionize the gas in front of the anode fast coil. A schematic electrical diagram of this circuit is shown in FIG. 8C.

It was also discovered that, prior to provision of the main pulse to the fast coil, it is beneficial to have the ability to adjust the configuration of the magnetic field in the gap between the fast coil and the anode to adjust the initial position of plasma formation in the puffed gas pulse prior to the pre-ionization step. This is accomplished by the provision of a slow bias capacitor 180 and a protection circuit both being installed in parallel with the fast coil and isolated therefrom by a controllable switch S2. A slow bias field is thus created prior to pre-ionization of the gas by the fast coil. This circuit is also shown in FIG. 8C.

Figure 8B:
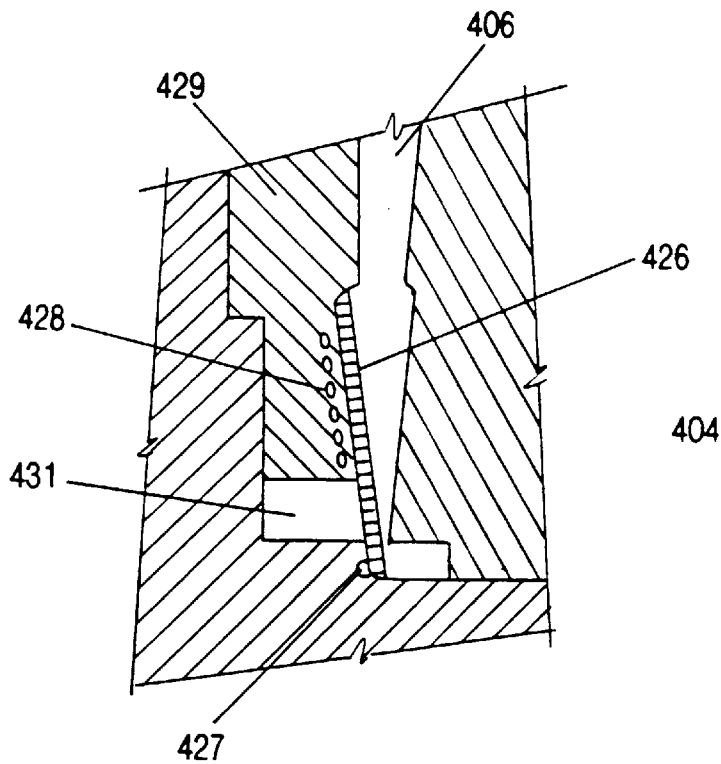
FIG. 8B is an expanded view of a portion of FIG. 8 showing the gas inlet valve and the gas inlet channel.
Figure 8C:
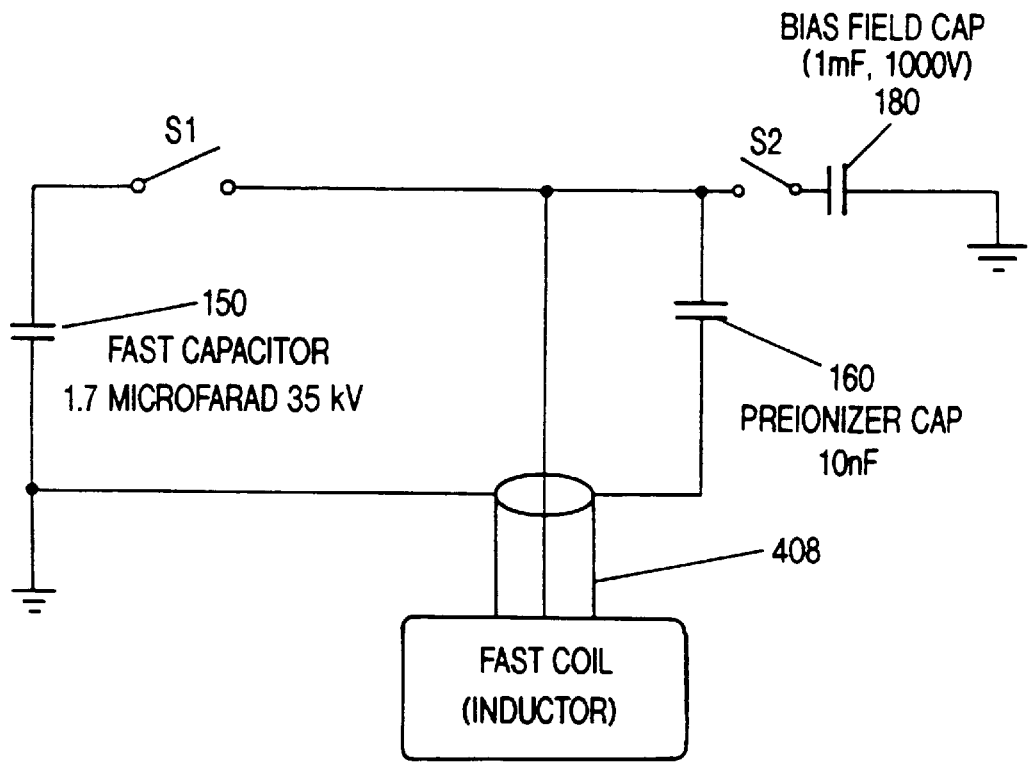
FIG. 8C is a schematic diagram of the electric circuit for the fast coil.

In further explanation of the electrical circuit for the fast coil as shown in FIG. 8C, the bias field capacitor 180 drives a greater than 1 microsecond risetime current in the fast coil before the main capacitor pulse begins. This allows adjustment of the field configuration produced by the fast capacitor current. The fast capacitor 150 drives a 1 microsecond risetime pulse in the fast coil. The preionizer capacitor 160 causes the voltage across the fast coil to ring with a much less than 1 microsecond period, inducing a large oscillating electric field in the gas to be ionized, leading to partial ionization of the gas. The rising magnetic field produced by the fast coil 408 pushes the ionized gas away from the fast coil, stagnating it against the preexisting magnetic field from the slow coil 414.

After pre-ionization the fast coil is then fully energized as described above to completely breakdown the gas into the plasma. After this pulse the field collapses back into the fast coil which is connected to a resistive load which is in turn connected to a heat sink, not shown. In the present embodiment, cooling channels in the supporting structure are used, but other solutions are possible and relatively straightforward. In this manner heat build up in the fast coil is avoided.

The fast coils of Greenly, et al. 408 have been redesigned from the reference fast coils in several ways as well as the heat sinking mentioned above. The gap between the fast coil and the anode electrodes 410 has been reduced with the result that the amount of necessary magnetic energy has been decreased by over 50%. The lower energy requirement permits repetitive use at higher frequencies and reduces the complexity of the feed system voltages for the fast coils. The design of the new flux-shaping anode electrode assembly has also contributed to these beneficial results.

The pulsed power signal from the power system is then applied to the anode assembly 35, accelerating ions from the plasma to form an ion beam K. The slow (S) and fast (F) magnetic flux structures, at the time of ion beam extraction, are shown in FIG. 8A. The definite separation between the flux from the fast coil from the flux from the slow coil is shown therein. This is accomplished by the flux-shaping effects of the anodes 410 and also by the absence of a slow coil located in the insulating structure 420 as was taught in the earlier MAP reference paper. The slow coils in the present MAP ion diode are located only in the cathode area of the MAP. This anode flux shaping in conjunction with the location of slow coils in the cathode assembly is different from that shown in the MAP reference paper and permits the high repetition rate, sustained operation of the MAP diode disclosed herein. This design allows the B=0 point (the separatrix) to be positioned near the anode surface, resulting in an extracted ion beam with minimal or no rotation. This minimal rotation is necessary for effective delivery of the beam to the material to be treated.

Figure 9:
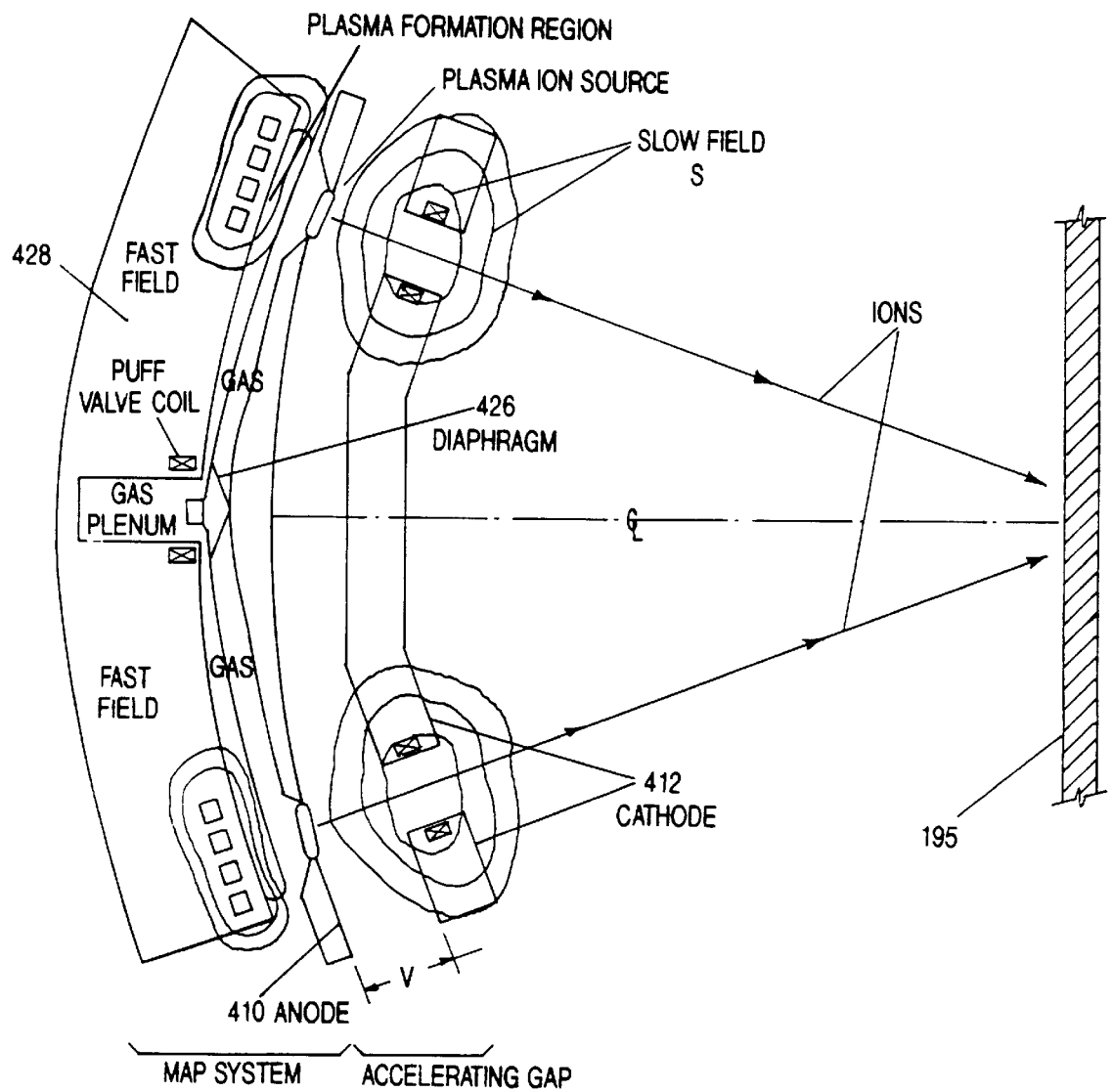
FIG. 9 is a schematic full cross-sectional view of the MAP ion diode.

FIG. 8B is a detailed view of the gas valve assembly 404 and the passage 425 which conducts the gas from the valve 404 to the area in front of the fast coil 408. The passage 425 has been carefully designed to deposit the gas in the localized area of the fast coil with a minimum of blow-by past this region. The details of the cross sections of the passage 425 were designed for supersonic transport of the gas puff. The design was done with readily available gas flow computer programs and is within the skill in the art. The gas valve flapper 426 is operated by a small magnetic coil 428 which opens and closes the flapper 426 upon actuation from the MAP control system. The flapper valve is pivoted on the bottom end 427 of the flapper. The coil 428 is mounted in a high thermal conductivity ceramic support structure 429 which is in turn heat sinked to other structure, not shown. Alternatively, externally cooled wires surrounding the coil could also serve to extract the heat from the coils. This heat sinking is necessary for the sustained operating capability of the MAP. The gas is delivered to the valve from a plenum 431 behind the base of the flapper. The plenum 431 should be visualized as being connected to a larger plenum located at the central core of the complete MAP ion diode as shown in FIG. 9.

The vacuum in the nozzle 406 rapidly draws the gas into the MAP once the flapper 426 is opened. The function of the nozzle is to produce a directed flow of gas only in the direction of flow and not transverse to it. Such transverse flow would direct gas into the gap between the anode and the cathode which would produce detrimental arcing and other effects. The reduction of the fast coil-anode gap discussed above makes the design of the nozzle very important to the successful operation of the MAP. Fortunately, gas flow design tools are available and were used to develop a nozzle with improved gas flow (higher mach number) and minimal boundary effects. This improved nozzle has an enlarged opening into the gap between the fast coil and the near edge of the anode which tapers from 9 to 15 mm instead of the straight walled 6 mm conduit in the reference MAP. The operating pressure of the gas in the puff valve has been increased from the range of 5–25 psig to the range of 25–40 psig. Experiments have confirmed much improved MAP operation as a result of this new design.

The ion diode of this invention is distinguished from prior art ion diodes in several ways. Due to its low gas load per pulse, the vacuum recovery within the MAP allows sustained operation up to and above 100 Hz. As discussed above, the magnetic geometry is fundamentally different from previous ion diodes. Prior diodes produced rotating beams that were intended for applications in which the ion beam propagates in a strong axial magnetic field after being generated in the diode. The present system requires that the ion beam be extracted from the diode to propagate in field-free space a minimum distance of 20–30 cm to a material surface. The magnetic configurations of previous ion diodes are incapable of this type of operation because those ion beams were forced by the geometries of those diodes to cross net magnetic flux and thus rotate. Such beams would rapidly disperse and be useless for the present purposes. By moving the slow coils (the diode insulating magnetic field coils) to the cathode side of the diode gap eliminated the magnetic field crossing for the beam but required a total redesign of the magnetic system for the anode plasma source.

The modifications to the fast coil discussed above can result in an energy requirement that is 5–10 times less than previous configurations. The modifications include: the elimination of a slow coil on the anode side of the diode and its associated feeds, better control over the magnetic field shaping and contact of the anode plasma to the anode electrode structure through use of the partially field-penetrable electrodes, the elimination of the separate pre-ionizer coil from the prior ion diodes, the circuit associated with the fast coil to provide "bias" current to adjust the magnetic field to place the anode plasma surface on the correct flux surface to eliminate beam rotation and allow optimal propagation and focusing of the beam, and the redesign of the gas nozzle to better localize the gas puff which enables the fast coil to be located close to the diode gap which in turn reduces the energy requirements and complexity of the fast coil driver.

The plasma can be formed using a variety of gas phase molecules. The system can use any gas (including hydrogen, helium, oxygen, nitrogen fluorine, neon, chlorine and argon) or vaporizable liquid or metal (including lithium, beryllium, boron, carbon, sodium, magnesium, aluminum, silicon, phosphorous, sulfur, and potassium) to produce a pure source of ions without consuming or damaging any component other than the gas supplied to the source. The ion beam K propagates 20–30 cm in vacuum ($\sim 10^{-3}$) to a broad focal area (up to 1000 cm$^2$) at the target plane 195, shown in FIG. 9, where material samples are placed for treatment and can thermally alter areas from 5 cm$^2$ to over 1000 cm$^2$.

The ion beam or MAP source 25 is capable of operating at repetitive pulse rates of 100 Hz continuously with long component lifetimes >$10^6$. The ion beam or MAP source 25, according to the principles of the present invention, draws ions from a plasma anode rather than a solid dielectric surface flashover anode used in present single pulse ion beam sources. Use of a flashover anode typically introduces a variety of contaminants to the surface of the material, often with detrimental results. One of the significant advantages of using the improved MAP source disclosed herein is that one has precise control over the components in the ion beam by controlling the composition of the gas source.

We claim:

1. A process of treating polymers, said process comprising: providing a system including a source of pulsed ion beams, said source capable of generating at least 1000 spatially contiguous pulses of high energy ions without interruption for repair or adjustment, each of said spatially contiguous pulses having a duration of less than 10 microseconds, a repetition rate of at least 1 Hz, a fluence of between 0.01 and 10 J/cm$^2$ with ion kinetic energies above 25 keV; and irradiating at least a portion of one surface of a polymer with at least one said pulses.

2. The process of claim 1 wherein said ion fluence is sufficient to produce an ion track density within said polymer such that reaction products produced along different ion tracks have a high probability of interaction with one another within the recombination time of the reaction products.

3. The process of claim 1 further including the step placing of a second layer of material over at least a portion of said surface, irradiating said second layer and said surface with an ion fluence sufficient to bond said second layer to said surface.

4. The process of claim 1 where said polymer is positioned as a layer covering a material to which said polymer is bonded after irradiation by said at least one of said pulses.

5. The process of claim 4, wherein said ion kinetic energies produces ion penetration depths >100 nm into said one surface of said polymer to produce crosslinking over said depths >100 nm.

6. The process of claim 1 further including the step of placing a mask layer above said one surface of said polymer to shield the regions of said polymer under said mask from the effects of said at least one of said pulses.

7. The process of claim 6 where said fluence from said at least one of said pulses is sufficient to etch away those regions of said polymer that are unshielded by said mask layer.

8. The process of claim 1 resulting in the pyrolyzation of the surface of the polymer.

9. The process of claim 1 resulting in the cross-linking of the irradiated polymer.

10. The process of claim 1 resulting in changes in electrical conductivity of the treated layer.

11. The process of claim 1 resulting in increased toughness and scratch resistance.

12. The process of claim 1 resulting in increased resistance to solvents and environmental degradation.

13. The process of claim 1, wherein each of said spacially contiguous pulses has a focal area of from 5 cm$^2$ to 1000 cm$^2$.

14. The process of claim 13, further including the step of shifting said at least a portion of said one surface of said polymer relative to said system, whereby said spatially contiguous pulses are shifted across said one surface of said polymer in an overlapping manner so as to form a continuous, treated polymer surface.

15. The process of claim 1 wherein said pulses of high energy ions are created from gas phase molecules by a Magnetically-confined Anode Plasma (MAP) ion diode.

16. The process of claim 1 wherein said polymer is selected from the group consisting of polyethylene, polypropylene, polycarbonate, poly(methyl methacrylate), poly(vinyl chloride), poly(tetrafluoroethylene), polyimide, polyethylene terephthalate and combinations thereof.

17. The process of claim 1 wherein the irradiation causes a modification of the adhesion characteristics of the surface.

18. The process of claim 1 wherein the irradiation modifies the topography of the surface.

19. The process of claim 1 wherein the irradiation causes etching of the surface.

20. The process of claim 1, wherein the heat per pulse delivered into said polymer and the interval between said spatially contiguous pulses are such that heat-induced degradation of said polymer is minimized.

21. The product of the process of claim 1.

22. The process of claim 1, wherein said ion kinetic energies produces ion penetration depths >100 nm into said one surface of said polymer to produce crosslinking over said depths >100 nm.

23. The process of claim 1, wherein said ion kinetic energies produces ion penetration depths >100 nm into said on surface of said polymer to produce a modified layer in said polymer over depths <1000 nm.

24. A system for treating polymers with one or more pulsed ion beams by irradiating at least one surface of at least one polymer with at least one pulse of high energy ions, said system including a source of pulsed ion beams capable of generating at least 1000 spatially contiguous pulses of said high energy ions without interruption for repair or adjustment of said source of pulsed ion beams, each of said spatially contiguous pulses having a duration of less than 10 microseconds, a repetition rate of at least 1 Hz, and a fluence of between 0.01 and 10 J/cm$^2$ with ion kinetic energies above 25 keV.

25. The system of claim 24, wherein said repetition rate is between 1 and 100 Hz.

26. The system of claim 24, wherein said source of pulsed ion beams is capable of generating between 1000 and 10$^6$ spatially contiguous pulses without interruption.

27. The system of claim 24, further including a target plane where said at least one polymer is placed for treatment, and wherein the focal area of each pulse in said target plane is up to 1000 cm$^2$.

28. The system of claim 27, wherein the focal area of each pulse in said target plane is between 5 and 1000 cm$^2$.

29. The system of claim 27, wherein said pulses can thermally alter surface areas over 1000 cm$^2$.

* * * * *